March 21, 1950 R. RAYMOND 2,501,093
HIGH-FREQUENCY MIXER
Filed May 30, 1945
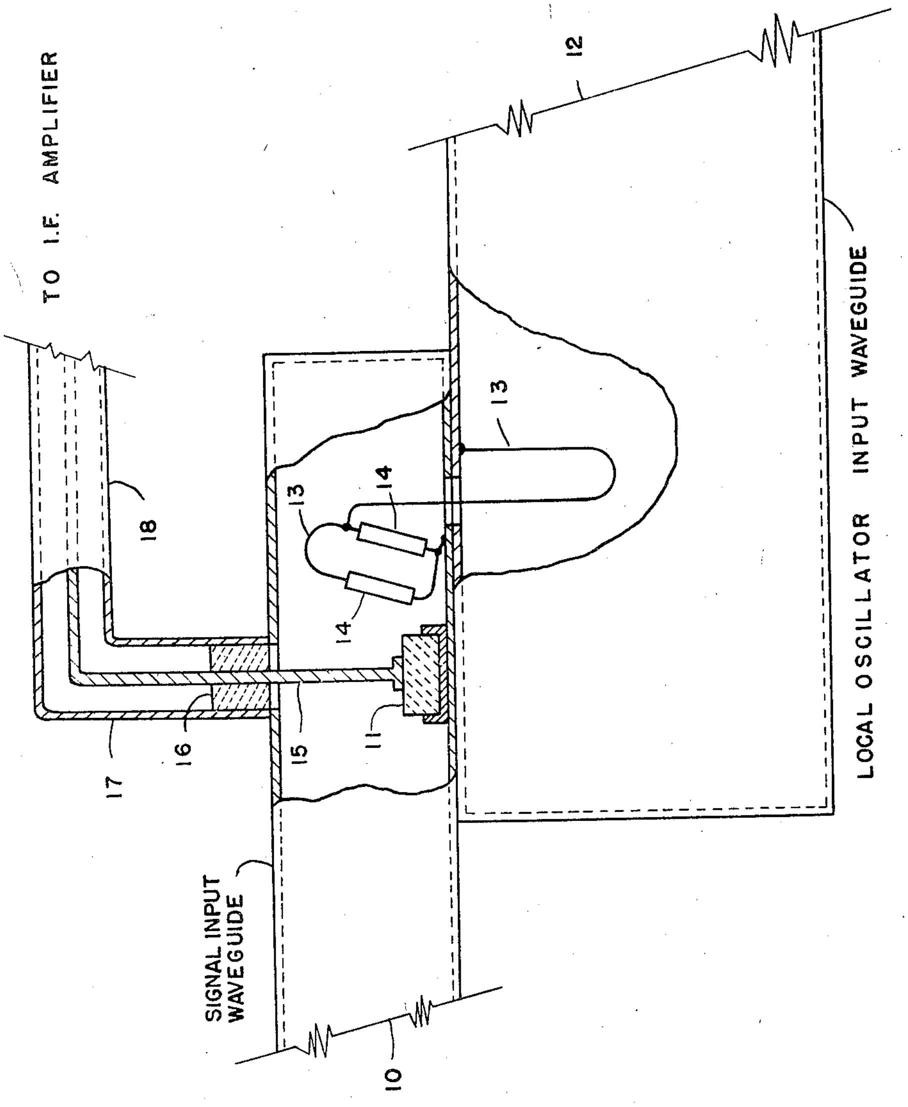
INVENTOR.
RICHARD RAYMOND
BY William D. Hall.
ATTORNEY Patented Mar. 21, 1950

2,501,093

UNITED STATES PATENT OFFICE 2,501,093

HIGH-FREQUENCY MIXER

Richard Raymond, State College, Pa., assignor to the United States of America as represented by the Secretary of War Application May 30, 1945, Serial No. 596,722

2 Claims. (Cl. 250—20)

The present invention relates generally to electrical circuits and more particularly to superheterodyne receiver frequency mixer circuits.

An object of this invention is to mix efficiently oscillations of two different high frequencies, one a signal frequency and the other a locally generated frequency, and then to select and to separate from other frequencies present a resultant desired fixed beat frequency and transmit it to succeeding receiver circuits.

The use of very high frequencies has introduced problems in the mixing of incoming signals with local oscillations which do not exist when lower frequencies are used. For example, the use of vacuum tubes, despite special design, as mixers for very high frequencies is limited and inefficient due to inherent characteristics of the vacuum tube. Use of crystals as mixers has removed some of the difficulties but serious problems still remain in conducting energy to the crystal without serious attenuation and in separating a pure intermediate frequency from the signal frequency, local oscillator frequency, and image frequency.

In the present invention a combination of two wave guides is used to introduce the signal and local oscillations to a crystal mixer and the arrangement is so designed that only the second harmonic of the local oscillator frequency is introduced into the mixer to be mixed with the incoming signal. The use of wave guides for transmission of high frequencies of the local oscillator and the received signal is advantageous in that said wave guides have much lower losses and, hence, less attenuation than does the conventional two conductor type of transmission line. Such low loss circuits are of prime importance in high frequency receivers, particularly in the input circuits which precede the mixer circuit, for it is in these circuits that the relative amplitude of the signal and the accompanying noise level is determined. The low noise level characteristic of a crystal mixer associated with the low loss characteristic of a wave guide over that of a conventional vacuum tube mixer, or of a crystal mixer used with transmission lines, provides a receiver input stage which permits the maximum signal to noise ratio to be obtained.

A receiver employing the present invention has several advantages when it is used with receivers designed for reception over a broad band of frequencies for monitoring purposes because of the absence of sharply tuned circuits and the consequent relative insensitiveness to variations in operating frequencies. The reception band width of a receiver employing the present invention is limited only by the cut-off frequency of the wave guides which act as high-pass filters. Each wave guide is designed to have a cut-off frequency below the lowest frequency at which it might be desired to operate the receiver. This makes possible the reception of numerous frequencies in the band width for which it is designed. Thus, signals will be received whose frequency is either above or below the local oscillator frequency used by an amount equal to the intermediate frequency and harmonics of signals will be received.

The use of the second harmonic of the oscillator frequency in the mixer permits the use of an oscillator of lower frequency than could otherwise be used and prevents transmission to the antenna circuit of the oscillator frequency because that frequency is below the cut-off frequency of the wave guide connecting the antenna to the mixer.

Other objects, features and advantages of this invention will suggest themselves to those skilled in the art and will become apparent from the following description of the invention taken in connection with the accompanying drawing which is a cross-sectional diagrammatic view of a preferred embodiment of the invention.

Referring to the drawing, signals from the antenna are led through the input wave guide 10 to a crystal mixer 11. The crystal mixer is of conventional design and contains a crystal selected for good operating characteristics at the band of frequencies over which the receiver is intended to receive. Crystal mixer 11 is coupled to local oscillator input wave guide 12 by means of coupling loop 13 which is shunt and series loaded by resistors 14, 14.

The oscillator frequency, transmitted by oscillator input wave guide 12 is coupled into the mixer 11 by the coupling loop 13. The mixer and coupling loop are in such proximity that the oscillator frequency and all its harmonics may be transmitted between them regardless of the cut-off frequency of signal input wave guide 10. The currents induced in mixer 11 by the oscillator frequency include the second harmonic of the oscillator frequency because of the non-linear character of the mixer resistance. Signal frequencies which might produce low frequency beats with the oscillator frequency are prevented from entering mixer 11 because such signal frequencies are all below the cut-off of signal input wave guide 10.

Heterodyning of different frequencies occurs in crystal mixer 11. The predominant frequencies of interest are the second harmonic of the oscillator frequency plus and minus the incoming signal frequency. Other frequencies will be present due to the heterodyning of harmonics of the incoming signal frequency and of other harmonics of the oscillator frequency but these will be of relatively low intensity. It is therefore desirable to select for the receiver intermediate frequency the frequency representing the difference between the second harmonic of the oscillator and the incoming signal frequency. This desired intermediate frequency is taken from crystal mixer 11 by center conductor 15 of a coaxial cable 18 which transmits it to an intermediate frequency amplifier of conventional design. The coaxial cable 18 has built in it a dielectric element 16 placed between inner conductor 15 and outer conductor 17 which acts as a condenser in shunt to the coaxial cable and, therefore, attenuates all higher frequencies but permits the desired low intermediate frequency to pass on to the intermediate frequency amplifier. Dielectric 16 should be placed near input wave guide 10 at an optimum position where there is a density of electrostatic lines of force.

Objectionable local radiation of the strong fundamental frequency of the oscillator is prevented by the choice of input wave guide 10 to have a cut-off frequency above that frequency. While input wave guide 10 may transmit to the antenna the second harmonic of the local oscillator the strength of said harmonic is relatively low and a slight radiation of same would not be objectionable.

While there has been here described what is at present considered to be the preferred embodiment of the invention, it will be obvious to those skilled in the art that various changes and modifications may be made therein without departing from the scope of the invention as set forth in the appended claims.

What is claimed is:

1. In a radio frequency circuit for receiving signals over a wide band of high frequencies, a mixer circuit comprising, a local oscillator capable of producing a fundamental and at least one harmonic frequency, a first wave guide capable of passing said frequencies, an external source of signals, a second wave guide capable of passing said signals, a first loop means extending into said first wave guide and terminating in a second loop means extending into said second wave guide to pass said oscillator frequencies from said first to said second wave guide, crystal mixing means within said second wave guide positioned near said second loop means to receive any frequencies from said second loop together with said signals in said first wave guide, condenser means in the output of said crystal mixing means, said local oscillator frequencies being passed through said first wave guide and, by means of said first and second loop means, into said second wave guide, to mix in said crystal means with said signals, the undesired frequencies being blocked by said condenser means, and resistive means in series with said second loop means, for decreasing the load on said local oscillator and broadening the frequency response of said loop means.

2. A wide-band, high-frequency mixer circuit including a local oscillator capable of producing a fundamental and at least a second harmonic frequency; a first wave guide capable of passing said frequencies; a second wave guide with a cut-off frequency above that of said second harmonic frequency, receptive of external input signals; a first loop means extending into said first wave guide and connected at one end to the inner wall of said first wave guide; a second loop means connected at one end to the other end of said first loop means and extending into second wave guide; resistive means connected between each end of said second loop means and the inner wall of said second wave guide means, whereby the loading of said oscillator by said first and second loop means is reduced and the frequency response of said first and second loop means is widened; crystal mixing means positioned within said second wave guide near to said second loop means, for mixing said second harmonic frequency from said local oscillator with said external signals; a coaxial cable having an inner and an outer conductor, said inner conductor being connected to said crystal mixing means, for conveying from said crystal mixing means the difference frequency between said second harmonic frequency and the frequency of said input signals; and dielectric means between said inner and outer conductors of said coaxial cable, for attenuating frequencies derived from said crystal mixer means which are higher than said difference frequency.

RICHARD RAYMOND.

REFERENCES CITED

The following references are of record in the file of this patent:

UNITED STATES PATENTS

| Number | Name | Date |
|---|---|---|
| 2,142,159 | Southworth et al. | Jan. 3, 1939 |
| 2,253,589 | Southworth | Aug. 26, 1941 |
| 2,260,844 | Thomas | Oct. 28, 1941 |
| 2,378,944 | Ohl | June 26, 1945 |
| 2,408,420 | Ginzton | Oct. 1, 1946 |
| 2,423,416 | Sontheimer et al. | July 1, 1947 |